United States Patent
Jin

(12)
(10) Patent No.: US 6,194,309 B1
(45) Date of Patent: Feb. 27, 2001

(54) METHOD FOR FORMING CONTACT

(75) Inventor: Gyo-Young Jin, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/366,552

(22) Filed: Aug. 4, 1999

(30) Foreign Application Priority Data

Aug. 10, 1998 (KR) ................................. 98-32460

(51) Int. Cl.$^7$ .................. H01L 21/425; H01L 21/22; H01L 21/4763
(52) U.S. Cl. ............... 438/639; 438/246; 438/514; 438/523; 438/533; 438/557; 438/558; 438/561; 438/637
(58) Field of Search .................... 438/637–640, 438/514–515, 706, 720, 522, 523, 530, 533, 557, 558, 561, 246

(56) References Cited

U.S. PATENT DOCUMENTS 5,252,517 * 10/1993 Blalock et al. ................... 438/396

5,985,762 * 11/1999 Geffken et al. ................... 438/687

* cited by examiner

Primary Examiner—Richard Booth
Assistant Examiner—Ha Tran Nguyen
(74) Attorney, Agent, or Firm—Jones Volentine, L.L.C.

(57) ABSTRACT

A method for forming a contact of a semiconductor device is described, in which a conductive layer pattern is electrically connected to a semiconductor substrate and an interlayer insulating film is formed on the semiconductor substrate including the conductive layer pattern. The interlayer insulating film is etched down to a top surface of the conductive layer pattern using a contact formation mask to form a contact hole. The conductive layer pattern is isotropically etched through the contact hole so as to extend the surface area of the exposed conductive layer pattern and the contact hole is filled with conductive material, forming a contact plug electrically connected to the conductive layer pattern. It is therefore possible to extend the contact area between the conductive layer pattern and a contact plug. As a result, the contact resistance is reduced.

13 Claims, 2 Drawing Sheets

METHOD FOR FORMING CONTACT

This application relies for priority upon Korean Patent Application No. 98-32460, filed on Aug. 10, 1998, the contents of which are herein incorporated by reference in their entirety.

FIELD OF THE INVENTION

The present invention relates to a method for fabricating a semiconductor device. More particularly the present invention relates to a method for forming a contact of a semiconductor device.

BACKGROUND OF THE INVENTION

As DRAM (dynamic random access memory) devices have become more finely structured, both the area of such devices and the diameter of contacts used on these devices have been reduced. Despite a reduction of both the area and the diameter in the horizontal direction, however, this fine structure does not effect the structural characteristics of a DRAM in the vertical direction. Accordingly, contacts must be both fine and long.

Referring to FIG. 1, a device isolation region (not shown) defining an active region and an inactive region is formed in a semiconductor substrate 10. A first conductive layer (not shown), a second conductive layer (not shown), and a gate mask 16 are formed over a semiconductor substrate 10 in the active region with a gate oxide layer (not shown) interposed between these layers and the substrate 10. The first and second conductive layers are then etched using the gate mask 16 as an etching mask to form a gate electrode of a double layer structure including first and second gate electrode portions 12 and 14.

After or before the formation of the insulating layer spacer 16, impurity ions are implanted to form a source/drain region (not shown) in the semiconductor substrate 10 outside of the area covered by the gate electrode 12 and 14. A first interlayer insulating film 20 is then formed over the semiconductor substrate 10 and the gate electrode 12 and 14.

The first insulating film 20 is penetrated by a first contact hole 21, and the resulting contact hole 21 is filled with a conductive material to form a contact pad 22 that is electrically connected to the source/drain region.

A second interlayer insulating film 24, including an embedded bit line 26, is then formed over the first interlayer insulating film 20. The second insulating film 24 is etched to form a second contact hole 28 that exposes a top surface of the contact pad 22. A silicon nitride layer spacer 30 is then formed on the sidewalls of the contact hole 28.

The second contact hole 28 is then filled with a conductive material to form a buried contact (BC) 32 that electrically connects a lower capacitor electrode to the contact pad 22. In order to make this electrical connection to the buried contact 32, a conductive layer (not shown) is formed over the second interlayer insulating film 24. The conductive layer is then patterned to form the lower capacitor electrode 34.

In the DRAM device of a capacitor over bit line (COB) structure, as described above, the buried contact 32 becomes fine and long. Furthermore, as shown in FIG. 1, the spacers 30 formed on the sidewalls of a contact hole may reduce the contact area between the contact pad 22 and the buried contact 32. As a result, the resistance between the contact pad 22 and the buried contact 32 increases, thereby slowing down the operation speed of the DRAM and potentially making an electrical open circuit, if the resistance is high enough.

SUMMARY OF THE INVENTION

It is therefore a principal feature of the present invention to provide a method for forming a contact capable of reducing the resistance between a contact pad and a buried contact.

In accordance with the present invention, a method is provided for forming a contact of a semiconductor device in which a conductive layer pattern is electrically connected to a semiconductor substrate and is buried in a first interlayer insulating film formed over both the semiconductor substrate, and the conductive layer pattern, which has the same level in height as the first interlayer insulating layer. This method comprises forming a second layer interlayer insulating film over the semiconductor substrate, including the conductive layer pattern, forming a contact hole by etching the second interlayer insulating film down to a top surface of the conductive layer pattern, using a contact formation mask, isotropically etching the conductive layer pattern through the contact hole to increase the surface area of an exposed portion of the conductive layer pattern, and filling the contact hole with a conductive material, to form a contact plug electrically connected to the conductive layer pattern.

The method may further comprise doping an impurity ion into the conductive layer pattern through the contact hole to increase at least the impurity concentration of the exposed portion of the conductive pattern, wherein the doping is performed after the isotropic etching. The impurity ion is preferably doped through one of an ion implanting process or a thermal doping process.

The method may further comprise forming an insulating layer having an etching selectivity with respect to the second interlayer insulating film over the interlayer insulating film and in the contact hole, after formation of the contact hole, isotropically etching the second insulating layer down to a top surface of a conductive pattern underlying the contact hole, to form a spacer on sidewalls of the contact hole, and etching a surface of the exposed conductive layer pattern to suppress etching damage of the surface of the conductive layer pattern and to remove etching impurities on the conductive layer pattern, wherein the surface of the conductive layer pattern is overetched to form a recess region.

The conductive pattern may comprise polysilicon; the interlayer insulating film may comprise an oxide; and the insulating layer may comprise $Si_3N_4$.

In the alternative, a method for forming a contact of a semiconductor device, is provided, comprising forming a conductive layer pattern over a semiconductor substrate, forming an interlayer insulating film over the conductive layer pattern, forming a contact hole in the interlayer insulating film, etching the conductive layer pattern through the contact hole to increase the surface area of an exposed portion of the conductive layer pattern, and filling the contact hole with a conductive material, to form a contact plug electrically connected to the conductive layer pattern.

In a novel method according to the present invention, an interlayer insulating film is etched to form a contact hole. The conductive layer pattern exposed through the contact hole is isotropically etched, thereby increasing the contact area between a contact hole and a contact plug formed by filling conductive material in the following process. Ions is implanted into the conductive layer pattern through the contact hole. In this way, it is therefore possible to increase the contact area between a contact pad and a contact plug (i.e., the interface between the buried contact and the contact pad) and to increase the surface impurity concentration of the contact pad contacted with the buried contact. As a result, the contact resistance between the buried contact and the contact pad can be reduced.

BRIEF DESCRIPTION OF THE DRAWINGS

The present invention may be understood from the detailed description of the preferred embodiment with reference to the accompanying drawings, in which.

DETAILED DESCRIPTION OF PREFERRED EMBODIMENTS

The present invention will now be described in greater details in conjunction with a preferred embodiment with reference to FIGS. 2A–2C.

Figure 1:
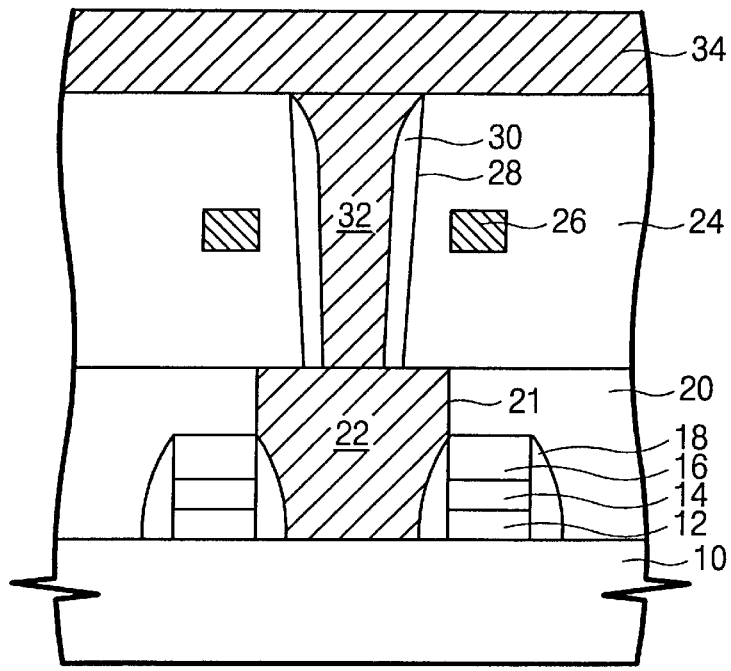
FIG. 1 is a sectional view illustrating a conventional dynamic random access memory (DRAM) device.
Figure 2A:
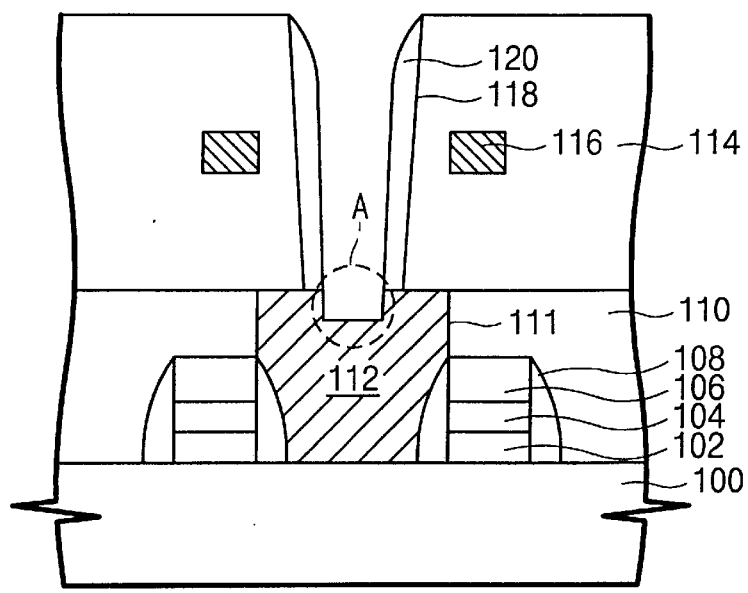
FIGS. 2A–2C are sequential sectional views illustrating a DRAM device according to a preferred embodiment of the present invention.

Referring to FIG. 2A, a device isolation region (not shown) defining an active region and an inactive region is formed in a semiconductor substrate 100. The device isolation region is formed, for example, by a shallow trench isolation (STI) method. A first conductive layer (not shown), a second conductive layer (not shown), as for a gate electrode component, and a gate mask 106 are formed over a semiconductor substrate 100 in the active region with a gate oxide layer (not shown) interposed between these layers and the substrate 100. The first conductive layer preferably comprises polysilicon, while the second conductive layer preferably comprises a metal silicide, such as tungsten silicide.

The first and second conductive layers are then etched using the gate mask 106 as an etching mask to form a gate electrode of a double layer structure, including layered first and second gate electrode portions 102 and 104. Only two gate electrodes are shown in the drawings for clarity and better understanding of the present invention.

After the gate electrode 102 and 104 is formed, an insulating layer spacer 108 is formed along the sidewalls of the gate electrode 102 and 104 and the gate mask. The insulating layer spacer 108 and the gate mask 106 may comprise, for example, SiN.

Using the gate electrode 102 and 104 as a mask, impurity ions are implanted into the substrate 100 to form a source/drain region of an LDD structure. After that, a third insulating layer is deposited over the resulting structure following its topology, and the third insulating layer is then etched back to form a sidewall spacer 108 on sidewalls of the gate electrode 102 and 104. Though not shown, after the formation of the spacer 108, impurity ions are implanted into the substrate using the spacer 108 as a mask in a peripheral circuit region of the substrate.

A first interlayer insulating film 110 is then formed over the semiconductor substrate 100 and the gate electrode 102 and 104. The first interlayer insulating film 110 may be an oxide layer. After it is deposited, the first interlayer insulating film 110 is planarized, preferably through a chemical mechanical polishing (CMP) process or an etch-back process.

A photoresist layer (not shown) is then formed over the first interlayer insulating film 110. The photoresist layer is patterned through a conventional photolithography process to form a photoresist pattern (not shown) defining a contact pad region. A portion of the first interlayer insulating film 110 is then etched down to a top surface of the source/drain region, using the photoresist pattern as mask, so that a contact pad formation opening 111 is formed. The photoresist pattern is then removed.

In order to fill the contact pad formation opening 111, a third conductive layer is formed over the first interlayer insulating film 110 and in the opening 111. This third conductive layer may be, for example, polysilicon. An etching process is then performed to remove any unwanted portions of the third conductive layer over the first interlayer insulating film 110 along both sides of the opening 111.

The etching process may, for example, be performed down to a top surface along both sides of the opening 111 through an etch-back process or the CMP process. As a result of this etching process, a contact pad 112 is formed that is electrically connected to the source/drain region.

A second interlayer insulating film 114, including an embedded bit line 116, is formed over the first interlayer insulating film 10 and the contact pad 112. Preferably, the second insulating film 114 is made of an oxide.

A second photoresist layer (not shown) is then formed over the second interlayer insulating film 114. A second photoresist pattern (not shown) defining a buried contact (BC) formation region is formed by patterning the second photoresist layer through a photolithography process. A portion of the second interlayer insulating film 114 is then etched down to a top surface of the contact pad 112 using the second photoresist pattern as a mask, thereby forming a BC hole 118.

An insulating layer (not shown) having an etching selectivity with respect to the second interlayer insulating film 114 is then formed over the second insulating film 114 and in the BC hole 118. This insulating layer is preferably made of $Si_3N_4$. The insulating layer is then anisotropically etched down to a top surface of the contact pad 112 and in the BC hole 118, so that an insulating layer spacer 120 is formed on the sidewalls of the BC hole 118. In later processes, the insulating layer spacer 120 prevents any insulating layer etchant from penetrating and then etching the second interlayer insulating film 114 along an interface of the BC hole 118.

In the description above, many process steps are only briefly described or are omitted altogether. However, these omitted or briefly-described process steps would be understood to one skilled in the art.

A surface film of the contact pad is then etched (by an etching process generally called a residue etching process) to remove any impurities created through the etching process for formation of the insulating layer spacer 120, and is also etched to suppress any etching damage of a top surface of the contact pad 112 generated through the etching process. The impurities and etching damage could serve to increase the contact resistance between the contact pad 112 and a contact plug (i.e., a buried contact) formed through the following process.

As shown in FIG. 2A, the etching process is performed on the contact pad 112 such that a recess region "A" is formed in the contact pad 112. This recess region "A" acts to increase the contact area allowed with the contact plug, thereby reducing its contact resistance.

Figure 2B:
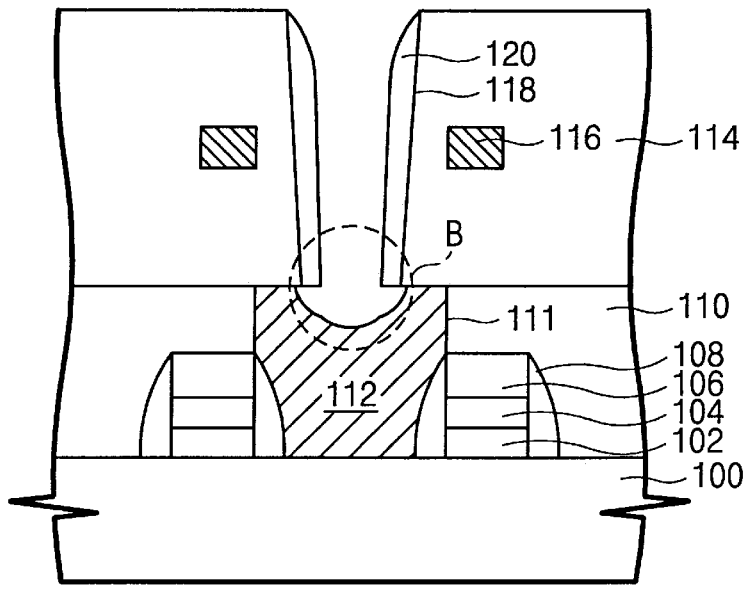

Referring to FIG. 2B, a cleaning process is then performed on the resultant structure. The surface of the contact pad 112 exposed by the BC hole 118 is isotropically etched during this cleaning process. Because of this cleaning process, the recess region "A" is extended in all directions, thereby expanding the exposed surface area to the exposed area "B" (compare the dimension "A" before the cleaning process with the dimension "B" after the cleaning process), which is exposed by the BC hole 118 and without contacting either the second interlayer insulating film 114 or the insulating layer spacer 120.

After enlarging the contact area of the contact pad, impurity ions are implanted to improve the impurity concentration at the top portion of the contact pad 112, which is to be in electrical contact with the later-formed buried contact 124 (i.e., the surface of the recess area "B" 122 of FIG. 2C). The impurity doping process may be performed, for example, through an ion implanting process or a thermal doping process and is preferably performed at a high concentration. In the preferred embodiment, the current doping technique reaches the concentration pf about $10^{12}$ atmos/$cm^3$.

Figure 2C:
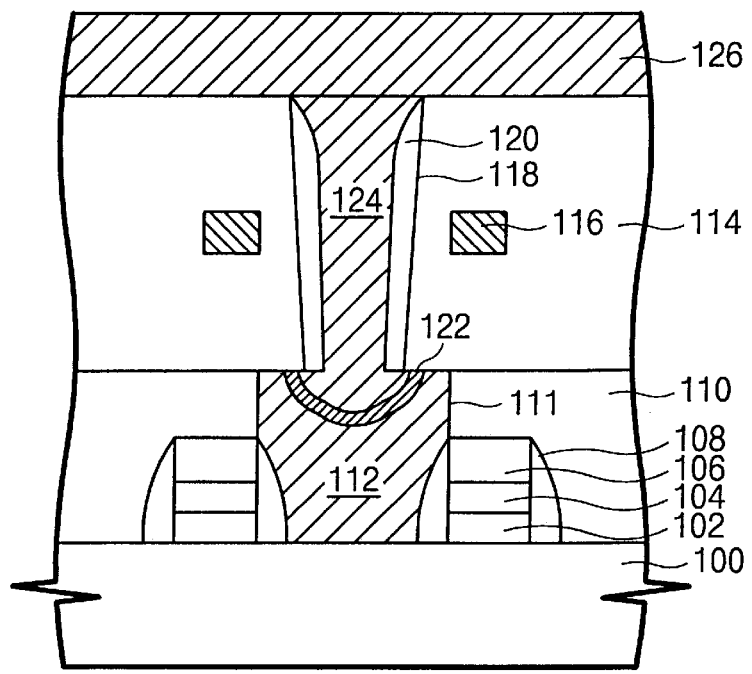

As shown in FIG. 2C, the BC hole 118 is then filled with a conductive material, which is then planarized to form a buried contact (BC) 124 (i.e., a contact plug) that is electrically connected to the contact pad 112. The planarization process may comprise an etch back process or a CMP process.

More particularly, in order to fill the BC hole 118 including the recess region "B" of the contact pad 112, a conductive layer (not shown), such as a polysilicon layer doped with a high concentration, is formed over the second insulating layer 114 and in the BC hole 118. A polysilicon etch-back process or a CMP process is performed to remove the unwanted portions of the polysilicon layer on the second interlayer insulating film 114 at both sides of the BC hole 118. Consequently, the buried contact 124 is formed.

A lower capacitor electrode 126 that is electrically connected to the BC 124 is then formed, and a hemispherical grain (HSG) to increase the efficient surface area of the lower capacitor electrode 126 is formed thereon. In order to electrically connect to the buried contact 124, a conductive layer (not shown) is formed over the second interlayer insulating film 114 including the buried contact 124, and the conductive layer is then patterned to form the lower capacitor electrode 126.

The buried contact 124 and the lower electrode 126 can be formed by a single photolithography process. Namely, after forming the BC hole and the subsequent impurity implantation, a conductive layer is deposited in the contact hole and on the second interlayer insulating film 114 to a thickness corresponding to the height of the lower electrode 126. Through a photolithography process, selected portions of the conductive layer are etched to form the lower electrode 126, which is electrically connected to the contact pad 112.

Since the contact area for the contact pad 112 exposed by the BC hole 118 is small, the contact resistance between a contact pad 112 and a buried contact 124 using only this contact area may increase. However, the present invention prevents this increase of the contact resistance by increasing the total contact area between the contact pad 112 and the buried contact 124 to an area greater than that exposed by the BC hole 118.

The contact pad is isotropically etched, through a BC hole, to increase the contact area between the contact pad 112 and the buried contact 124 formed through the process described above. This increases the impurity concentration of a surface of the contact pad 112 contacted with the buried contact 124 through the BC hole 118, and reduces the contact resistance between the two.

The present invention is not restricted to the above embodiment, and it is clearly understood that many variations can be possible within the scope and spirit of the present invention, as would be understood by anyone skilled in the art.

What is claimed is:

1. A method for forming a contact of a semiconductor device in which a conductive layer pattern is electrically connected to a semiconductor substrate and is formed in a first interlayer insulating film that is formed over the semiconductor substrate, the method comprising:

forming a second interlayer insulating film over the first interlayer insulating film and the conductive layer pattern;

forming a contact hole by etching the second interlayer insulating film down to a top surface of the conductive layer pattern;

forming a sidewall spacer on sidewalls of the contact hole;

etching the conductive layer pattern through the contact hole to recess a predetermined depth from a bottom of the contact hole, to increase the surface area of an exposed portion of the conductive layer pattern;

doping an impurity ion into the conductive layer pattern through the contact hole to increase at least the impurity concentration of the exposed portion of the conductive pattern, wherein the doping is performed after the etching of the conductive layer pattern; and filling the contact hole with a conductive material.

2. A method for forming a contact of a semiconductor device, as recited in claim 1, wherein the conductive pattern comprises polysilicon.

3. A method for forming a contact of a semiconductor device, as recited in claim 1, wherein the impurity ion is doped through one of an ion implanting process or a thermal doping process.

4. A method for forming a contact of a semiconductor device, as recited in claim 1, wherein forming the sidewall spacer comprises:

forming an insulating layer having an etching selectivity with respect to the second interlayer insulating film over the second interlayer insulating film and in the contact hole; and isotropically etching the insulating layer down to a top surface of the conductive pattern, to form the sidewall spacer on sidewalls of the contact hole.

5. A method for forming a contact of a semiconductor device, as recited in claim 4, further comprising etching a surface of the exposed conductive layer pattern to suppress etching damage of the surface of the conductive layer pattern and to remove etching impurities on the conductive layer pattern, wherein the surface of the conductive layer pattern is overetched to form a recess region.

6. A method for forming a contact of a semiconductor device, as recited in claim 1, further comprising cleaning the recessed portion of the conductive layer pattern, wherein the cleaning isotropically etches the recessed portion and further increases the surface area of the exposed portion of the conductive layer pattern.

7. A method for forming a contact of a semiconductor device, as recited in claim 6, wherein the sidewall spacer comprises $Si_3N_4$.

8. A method for forming a contact of a semiconductor device, comprising:

forming a conductive layer pattern over a semiconductor substrate;

forming an interlayer insulating film over the conductive layer pattern;

forming a contact hole in the interlayer insulating film;

forming a sidewall spacer on sidewalls of the contact hole;

etching the conductive layer pattern through the contact hole to recess a predetermined depth from a bottom of the contact hole, increase the surface area of an exposed portion of the conductive layer pattern;

doping an impurity ion into the conductive layer pattern through the contact hole to increase at least the impurity concentration of the exposed portion of the conductive pattern, wherein the doping is performed after the etching of the conductive layer pattern; and filling the contact hole with a conductive material.

9. A method for forming a contact of a semiconductor device, as recited in claim 8, further comprising cleaning the recessed portion of the conductive layer pattern, wherein the cleaning isotropically etches the recessed portion and further increases the surface area of the exposed portion of the conductive layer pattern.

10. A method for forming a contact of a semiconductor device, as recited in claim 8, wherein the conductive pattern comprises polysilicon.

11. A method for forming a contact of a semiconductor device, as recited in claim 9, wherein the impurity ion is doped through one of an ion implanting process or a thermal doping process.

12. A method for forming a contact of a semiconductor device, as recited in claim 8, wherein forming the sidewall spacer comprises:

forming an insulating layer having an etching selectivity with respect to the interlayer insulating film over the interlayer insulating film and in the contact hole, after formation of the contact hole; and isotropically etching the insulating layer down to a top surface of a conductive pattern underlying the contact hole, to form a spacer on sidewalls of the contact hole.

13. A method for forming a contact of a semiconductor device, as recited in claim 12, wherein the insulating layer comprises $Si_3N_4$.

* * * * *